United States Patent [19]

D'Angelo et al.

[11] Patent Number: 4,756,791
[45] Date of Patent: Jul. 12, 1988

[54] CHEMICAL VAPOR DEPOSITION PROCESS FOR PRODUCING METAL CARBIDE OR NITRIDE WHISKERS

[75] Inventors: Charles D'Angelo, Southboro; Joseph G. Baldoni, II, Norfolk; Sergej-Tomislav Buljan, Acton, all of Mass.

[73] Assignee: GTE Laboratories Incorporated, Waltham, Mass.

[21] Appl. No.: 899,833

[22] Filed: Aug. 25, 1986

[51] Int. Cl.$^4$ ................ C01B 31/30; C01B 21/06; C30B 75/00

[52] U.S. Cl. .................................... 156/610; 156/613; 156/DIG. 99; 156/DIG. 112; 423/411; 423/440

[58] Field of Search ............ 156/DIG. 112, 99, 613, 156/610; 422/245; 423/409, 411, 440, 439

[56] References Cited

U.S. PATENT DOCUMENTS

| | | | |
|---|---|---|---|
| 3,244,480 | 4/1966 | Johnson et al. | 23/191 |
| 3,403,008 | 9/1968 | Hamling | 23/344 |
| 3,437,443 | 4/1969 | Hertl | 23/202 |
| 3,582,271 | 6/1971 | Minagawa et al. | 23/142 |
| 3,752,655 | 8/1973 | Ramqvist | 29/182.5 |
| 3,813,224 | 5/1974 | Hollander, Jr. | 23/273 SR |
| 3,979,500 | 9/1976 | Sheppard et al. | 423/289 |
| 4,214,037 | 7/1980 | Galasso et al. | 428/367 |
| 4,500,504 | 2/1985 | Yamamoto | 423/345 |
| 4,521,393 | 6/1985 | Saito et al. | 423/344 |
| 4,525,335 | 6/1985 | Tanaka et al. | 423/344 |
| 4,552,740 | 11/1985 | Morgan et al. | 423/344 |
| 4,569,886 | 2/1986 | Divecha et al. | 428/379 |
| 4,579,699 | 4/1986 | Verzemnieks | 264/043 |
| 4,604,273 | 8/1986 | Czupryna et al. | 423/344 |

OTHER PUBLICATIONS

MCIC Report No. MCIC-86-51, "Ceramic-Ceramic Composites," (Department of Defense, 1986).
Akio Kato et al., *J. Crystal Growth*, 37, pp. 293-300 (1977).
Akio Kato et al., *J. Crystal Growth*, 49, pp. 199-203 (1980).
Keiji Naito, *J. Crystal Growth*, 45, pp. 506-510 (1978).
H. Altena et al., *Euro CVD Four, Proc. Eur. Conf. Chem. Vap. Deposition, 4th* J. Bloem, Ed., pp. 428-434 (1983).
M. Futamoto et al., *J. Crystal Growth*, 61, pp. 69-74 (1983).
Kenji Hamamura et al., *J. Crystal Growth*, 26, pp. 255-260 (1974).
Takehiko Takahashi et al., *J. Electrochem. Soc.*, 117, pp. 541-545 (1970).
Nobuyuki Tamari et al., *J. Less-Common Metals*, 58, pp. 147-160 (1978).
Nobuyuki Tamari et al., *J. Crystal Growth*, 46, pp. 221-237, (1979).
Wokulski et al., *J. Crystal Growth*, 62, pp. 439-446 (1983).
Wokulski et al., *Conf. Appl. Crystallogr.*, 11, pp. 258-263 (1984).

*Primary Examiner*—Asok Pal
*Attorney, Agent, or Firm*—Frances P. Craig

[57] ABSTRACT

A chemical vapor deposition process for producing single crystal whiskers of metal carbides, nitrides, or carbonitrides involving flushing a reaction chamber including a suitable substrate surface heated to 1025°-1125° C., and flowing reactant gases past the substrate to form whiskers. The reactants comprise a halide of Ti, Zr, Hf, Nb, Ta or W and one or more of nitrogen, ammonia and suitable aliphatic hydrocarbons. The atomic ratio of carbon and/or nitrogen to metal is about 5:1 to 16:1; the volume ratio of hydrocarbon and/or nitrogen and/or ammonia to hydrogen is about 1:50-1:20. The preferred substrate materials are nickel or a high nickel alloy coated with TiC or TiN, or, for carbide whiskers, nickel impregnated graphite. The reactor walls and internal fixtures preferably provide the substrate surfaces. A more efficient batch process and a continuous process for whisker growth are disclosed.

34 Claims, 3 Drawing Sheets

CHEMICAL VAPOR DEPOSITION PROCESS FOR PRODUCING METAL CARBIDE OR NITRIDE WHISKERS

CROSS-REFERENCE TO RELATED APPLICATIONS

This application contains subject matter related to matter disclosed in copending patent application Ser. Nos. 899,835 and 899,834 both filed concurrently with the present application and both assigned to the same Assignee as the present application. Application Ser. Nos. 899,835 and 899,834 are incorporated herein by reference.

FIELD OF THE INVENTION

This invention relates to a process for producing single crystal metal carbide, nitride, or carbonitride whiskers, particularly for producing metal carbide, nitride, or carbonitride whiskers by a chemical vapor deposition process.

BACKGROUND OF THE INVENTION

In recent years there has been an increasing need for composite materials having high fracture toughness, hardness and wear resistance for use in cutting tools, wear parts, and structural applications such as dies, turbines, nozzles, and the like. Due to their high modulus of elasticity, high hardness, and high strength, single crystal whiskers of such materials as carbides or nitrides of titanium, zirconium, hafnium, niobium, tantalum, and tungsten could present attractive materials for composite technology. However, prior to the present invention, methods for producing such whiskers in commercial quantities have not been known. Known laboratory methods for producing whiskers of metal carbides or nitrides, for example, titanium carbide, involve placing a substrate material suitable for whisker growth, for example a graphite or mullite plate or tube, at the center of a quartz tube, and heating the substrate to a temperature suitable for whisker growth. Typical temperatures in such reactors range from about 800°–1400° C. The reactor tube is flushed with hydrogen, and reactant gases, typically in a molar ratio of carbon or nitrogen to metal of about 1:1, are flowed through the heated reactor to form whiskers on the substrate. The prior art processes have presented the disadvantages of decomposition of reactants subjected to extreme temperatures before reaching the substrate material, lack of control of whisker morphology and dimensions, and limitations on the efficiency of whisker production by such methods.

SUMMARY OF THE INVENTION

The present invention provides an efficient process for producing metal carbide, nitride, or carbonitride whiskers of controlled dimensions, morphology, and quality.

The process according to the invention involves flushing a reaction chamber sealed from the ambient atmosphere with flowing hydrogen gas. The reaction chamber includes one or more substrate surfaces formed from one or more substrate materials suitable for providing catalyzing and supporting substrates for nucleation and growth of the whiskers. The substrate surfaces are maintained at an operating temperature of about 1025°–1125° C., preferably about 1075°–1100° C. The hydrogen flowing through the reaction chamber is then mixed, at about ambient pressure, with reactants comprising one or more metal halide gases, where the metal is titanium, zirconium, hafnium, niobium, tantalum, or tungsten, and one or more gases selected from the group consisting of nitrogen, ammonia, and aliphatic hydrocarbon gases pyrolyzable at the operating temperature to form free carbon. The atomic ratio of carbon plus nitrogen to metal in the incoming gases is about 5:1 to 16:1, preferably about 8:1 to 12:1, and the volume ratio of hydrocarbon, plus nitrogen gas, plus ammonia to hydrogen is about 1:5 to 1:20. The flowing mixture of gases is maintained at a suitable linear velocity, preferably about 120–140 cm/sec, for a time sufficient to nucleate and grow metal carbide, nitride, or carbonitride whiskers on the substrate material surfaces. The preferred metal halide gas is a chloride of titanium, zirconium, hafnium, niobium, tantalum, or tungsten. The preferred hydrocarbon gases are compounds of the formulas $C_nH_{2n+2}$, $C_nH_{2n}$, or $C_nH_{2n-2}$, where n is a positive integer of 1–4.

An alternate embodiment of the process according to the invention for producing metal carbide whiskers involves heating a reaction chamber sealed from the ambient atmosphere to an operating temperature between about 1025°–1125° C., preferably 1075°–1100° C., in an inert atmosphere. The reaction chamber includes one or more substrate surfaces formed from one or more substrate materials. The substrate materials are nickel or an alloy containing at least 50% by weight nickel, coated with a titanium carbide or nitride layer about 20–30 microns thick, or graphite impregnated with about 0.1–1.0 mole % nickel. The heated reaction chamber is flushed with flowing hydrogen gas. Where the one or more substrate materials include titanium carbide or nitride coated nickel or nickel alloy, the hydrogen flowing through the flushed reaction chamber is first mixed with an aliphatic hydrocarbon gas pyrolyzable at the operating temperature to form free carbon, in a molar ratio, at a flow rate and for a time sufficient to form a thin film of pyrolytic carbon on at least the titanium carbide coated nickel or nickel alloy substrate material surfaces. The hydrogen flowing through the reaction chamber is then mixed, at about ambient pressure, with reactants including one or more metal halide gases, i.e. halides of one or more of titanium, zirconium, hafnium, niobium, tantalum, and tungsten, and preferably chlorides of these metals, and one or more aliphatic hydrocarbon gases pyrolyzable at the operating temperature to form free carbon. The preferred reactant hydrocarbon gases are compounds of the formulas $C_nH_{2n+2}$, $C_nH_{2n}$ or $C_nH_{2n-2}$, where n is a positive integer of 1–4, and may be the same or different from the carbon film producing hydrocarbon described above. The atomic ratio of carbon to metal of the reactant is about 5:1 to 16:1, preferably about 8:1 to 12:1. The volume ratio of hydrocarbon to hydrogen is about 1:5 to 1:20, the flowing mixture of gases is maintained at a linear velocity of about 120–140 cm/sec, for a time sufficient to nucleate and grow metal carbide whiskers on the substrate material surfaces. The preferred metal halide gas is $TiCl_4$. The most preferred hydrocarbon gases are methane, propane, or acetylene.

In a preferred process according to the invention, the reactor includes a collection chamber sealed from the ambient atmosphere, arranged generally vertically below and open to the reaction chamber, and adapted to be maintained at a temperature sufficiently below the operating temperature to preclude significant whisker production in the collection chamber. Periodically, at least once during the whisker growth, at least some of the whiskers are mechanically detached from the substrate to fall downward into the collecting chamber to permit additional whiskers to nucleate and grow on the substrates.

The most preferred embodiment according to the invention provides a process suitable for the controlled production in commercial quantities of single crystal metal carbide, nitride, or carbonitride whiskers. The process involves flushing a reaction chamber sealed from the ambient atmosphere with flowing hydrogen gas, the reaction chamber being defined by surfaces of which at least a major portion of the surface area is formed from one or more substrate materials suitable for providing catalyzing and supporting substrates for nucleation and growth of the whiskers. The substrate material surfaces are maintained at an operating temperature of about 1025°–1125° C., preferably about 1075°–1100° C. The hydrogen flowing through the reaction chamber is then mixed, at about ambient pressure, with reactants comprising one or more metal halide gases, where the metal is as defined above, and one or more gases selected from the group consisting of nitrogen, ammonia, and aliphatic hydrocarbon gases pyrolyzable at the operating temperature to form free carbon. The atomic ratio of carbon plus nitrogen to metal in the incoming gases is about 5:1 to 16:1, preferably about 8:1 to 12:1, and the volume ratio of hydrocarbon, plus ammonia, plus nitrogen gas to hydrogen is about 1:5 to 1:20. The flowing mixture of gases is maintained at a suitable linear velocity, preferably about 120–140 cm/sec, for a time sufficient to nucleate and grow metal carbide, nitride, or carbonitride whiskers on the substrate material surfaces. The preferred metal halide gas is a chloride of one of the metals defined above. The preferred hydrocarbon gases are compounds of the formulas $C_nH_{2n+2}$, $C_nH_{2n}$, or $C_nH_{2n-2}$, where n is a positive integer of 1–4.

The preferred substrate materials for the whisker growth are nickel or an alloy containing at least 50% by weight nickel, coated with a titanium carbide or nitride layer about 20–30 microns thick, or, for carbide or carbonitride whiskers, graphite impregnated with about 0.1–1.0 mole % nickel. Where the one or more substrate materials include titanium carbide or nitride coated nickel or nickel alloy, and for carbide whisker growth, the hydrogen flowing through the flushed reaction chamber, is first mixed with an aliphatic hydrocarbon gas pyrolyzable at the operating temperature to form free carbon, in a molar ratio, at a flow rate and for a time sufficient to form a thin film of pyrolytic carbon on at least the titanium carbide or nitride coated nickel or nickel alloy substrate material surfaces. The hydrogen flowing through the reaction chamber is then mixed with the reactants as described above.

BRIEF DESCRIPTION OF THE DRAWINGS

Details relating to the processes of this invention, as well as the advantages derived therefrom, will be more fully appreciated by referring to the Detailed Description of the Preferred Embodiments taken in connection with the Drawings, in which.

DETAILED DESCRIPTION OF THE PREFERRED EMBODIMENTS

An illustrative process according to the invention involves growing metal carbide whiskers on a high nickel alloy substrate surface coated with a thin coat of titanium carbide, in the reaction chamber of a vessel sealed from the ambient atmosphere. The substrate surface is heated to an operating temperature of about 1025°–1125° C., preferably 1075°–1100° C., while being flushed with an inert gas. The reaction chamber is then flushed with hydrogen gas, flowing at about ambient pressure to clean the reaction chamber of any impurities present which may affect whisker growth.

Following the flushing of the reactor with hydrogen, a suitable pyrolyzable hydrocarbon as described above, for example methane, is introduced to the hydrogen stream and allowed to flow through the reaction chamber for several minutes. The hydrocarbon contacting the heated substrate surface is pyrolyzed at the operating temperature to form a thin film of free carbon on the substrate surface. The pressure within the reaction chamber preferably is maintained at about 1 atmosphere throughout the operation of the reactor, although operation at about 1–2 atmospheres is possible.

Following the coating of the substrate surface with free carbon, the flow of hydrocarbon and hydrogen is maintained, with the addition of a suitable metal halide gas as described above, for example, titanium tetrachloride, in an amount suitable for whisker growth. The atomic ratio of carbon to metal in the reactant gases is maintained at about 5:1 to 16:1, preferably 8:1 to 12:1, and the volume ratio of hydrocarbon to hydrogen at about 1:5 to 1:20. The flow of reactant gases is maintained, preferably at a linear velocity of about 120–140 cm/sec, for a time sufficient for whisker nucleation and growth, normally about 1–6 hrs. Following the whisker growth, the flows of reactant gases are stopped, and the flow of hydrogen gas is maintained, while the substrate surface is cooled to ambient temperature. Finally, the reaction chamber is flushed with an inert gas such as argon and the reactor is opened for removal of the whiskers. In an alternative process, the substrate surface is a nickel doped graphite material as described above, and the step of coating the substrate with free carbon is omitted. All other steps of the process are the same as above.

In a similar illustrative process according to the invention, metal nitride whiskers are grown in the reactor described above with respect to the metal carbide whiskers, and the high nickel alloy substrate. The process is the same as that for growing the metal carbide whiskers with the exception that no film of free carbon is deposited on the substrate surface, and the hydrocarbon for whisker growth is replaced by an equivalent amount of nitrogen gas or ammonia in the reactant gases. Similarly, metal carbonitride whiskers may be grown by including both the hydrocarbon and nitrogen gas or ammonia in the reactant gases. The coated nickel and nickel alloy substrates, and the nickel doped graphite substrates are all suitable for growth of carbonitride whiskers. For the nickel and nickel alloy substrates, deposition of a thin film of carbon is optional for growth of the carbonitride whiskers.

Figure 1:
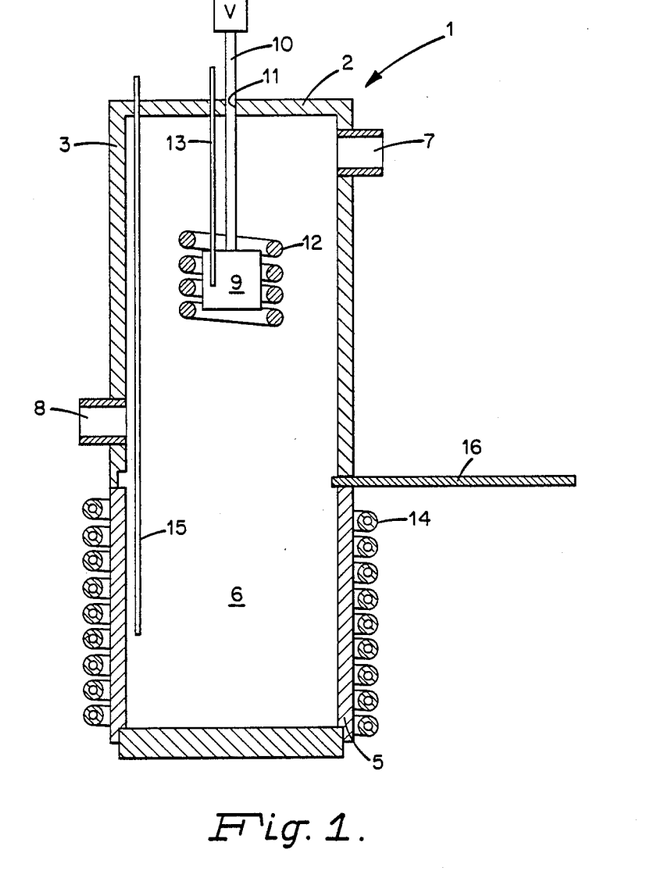
FIG. 1 is a cross-sectional view of a reactor utilized in a preferred process according to the invention.

A method illustrative of another embodiment of the invention involves reactor 1 illustrated schematically in FIG. 1, in which reaction vessel 2 comprises cylindrical upper portion 3 generally enclosing upper reaction chamber 4 and cylindrical lower portion 5 providing lower collecting chamber 6. Inlet means 7 and outlet means 8 are provided in the reaction vessel to permit the flowing gas to enter and exit the vessel in such a way that gas flow path is established permitting optimum contact of the flowing gases with substrate surface 9, preferably a high nickel alloy coated with a thin layer of titanium carbide. Axial support rod 10 extends from outside reaction vessel 2, entering the reaction vessel through sealed opening 11 to support substrate surface 9 within reaction chamber 4. Heating means 12 is disposed to heat substrate surface 9 to the operating temperature. Optionally, the operating temperature may be monitored by thermocouple 13 disposed adjacent the substrate surface. The entire reactor including both the upper and the lower chambers is sealed from the ambient atmosphere by known means, not shown, to prevent contamination of the whiskers grown therein. Axial rod 10 and substrate surface 9 may be mechanically shaken or vibrated for removal of whiskers growing on the substrate surface by means of a vibrating means, shown as V in FIG. 1, connected to axial rod 10. The vibrator may be actuated intermittently during whisker growth to cause some of the whiskers to detach from the substrate surfaces. The detached whiskers then fall gravitationally downward from reaction chamber 4 into collecting chamber 6, freeing at least some of the substrate surface in the reaction chamber for additional whisker growth. If necessary, cooling means 14, associated with lower portion 5, may be provided to maintain collecting chamber 6 at a temperature sufficiently below the operating temperature to preclude significant reaction of the reactant gases in the collecting chamber. Thermocouple 15 may be provided to extend into collecting chamber 6 to monitor the temperature therein.

In operation, the heating and hydrogen flushing steps, the coating of the substrate with carbon, if necessary, and the introduction of the reactant gases are carried out in the same manner as that described above. The flowing gases enter reaction chamber 4 through inlet means 7, flow past substrate 9, and exit the reactor through outlet means 8. During the whisker growth step, the reactant gases are carried past heated substrate surface 9, causing nucleation and growth of whiskers on the substrate surface. Reactant gases remaining in the stream of flowing gases leaving reaction chamber 4 may flow into cooler collecting chamber 6 before exiting through outlet means 8. The temperature in collecting chamber 6 may be monitored by thermocouple 15, and is maintained below the temperature required for significant reaction of the reactant gases. If necessary, the temperature in the collecting chamber may be controlled by cooling means 14. Thus, no significant reaction of the reactant gases occurs within the collecting chamber 6.

After the reactant gases are allowed to flow past the substrate surface for a time sufficient to grow whiskers of a desired size, normally about 1–6 hrs, vibrating means V is actuated to mechanically detach whiskers from substrate surface 9. The detached whiskers fall gravitationally downward into cooler collecting chamber 6, where whisker growth ceases. Continued flow of reactant gases past the substrate results in nucleation and growth of additional whiskers on the substrate surface. The detachment step and growth of additional whiskers may be repeated intermittently throughout the whisker growth period, until the collecting chamber is full. The reactor is then shut down, cooled and opened in a manner similar to that described above.

Alternatively, the reactor may be adapted for continuous operation. A reversible sealing means, such as sealing means 16 illustrated schematically in FIG. 1, may be provided to intermittently seal off collecting chamber 6 from reaction chamber 4. The collected whiskers are then removed from collecting chamber 6, and sealing means 16 withdrawn to reopen the collecting chamber to the reaction chamber for collection of whiskers during the next detaching step. Throughout the operation, the ambient atmosphere may be excluded from the reactor in known manner.

In the most preferred method according to the invention, a major portion (greater than 50%) of the surface area of the outer walls and inner fixtures of the reaction chamber is formed from, or lined, coated or plated with one or more materials suitable for substrate surfaces. These surfaces are heated to the operating temperature during operation so that large areas of suitable substrate material or materials are available for whisker growth. The preferred materials for construction of the reactor and/or internal fixtures for carbide, nitride, or carbonitride whisker growth are nickel or a high nickel alloy such as Inconel. For the carbide whiskers, the nickel or nickel alloy substrate surfaces preferably are coated with a thin layer of titanium carbide or nitride, or graphite impregnated with nickel may be used for the substrate surfaces.

Figure 2:
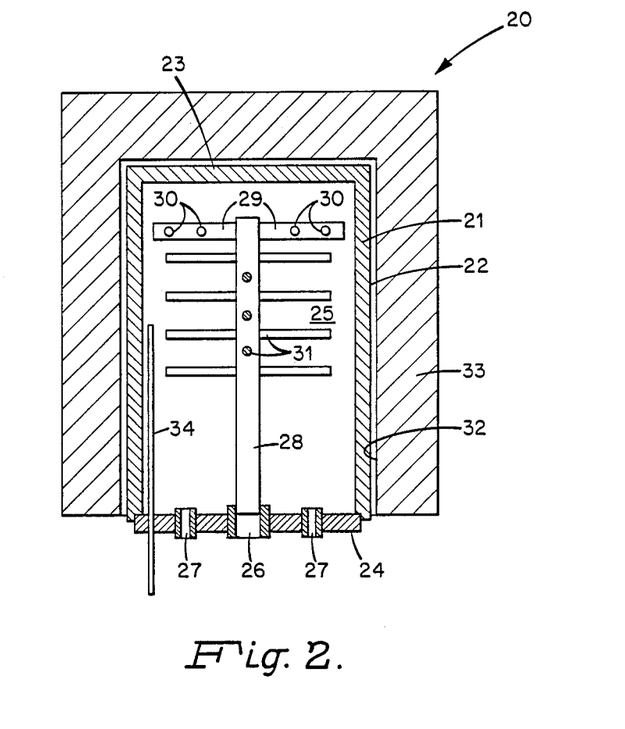
FIG. 2 is a cross-sectional view of a reactor utilized in another preferred process according to the invention.

An illustrative method according to this most preferred embodiment of the invention involves growing titanium carbide whiskers in a sealed reactor constructed of a high nickel alloy material, for example Inconel having a composition in weight % of about 76% Ni, coated with a thin coat of TiC. FIG. 2 shows such a reactor, 20, comprising reaction vessel 21 having cylindrical side walls 22, top wall 23, and removable bottom wall 24, all preferably formed of high nickel alloy, and enclosing reacting chamber 25. Bottom wall 24 includes inlet opening 26, concentric with bottom wall 24, and outlet ports 27. Conduit 28, centrally disposed along the axis of reaction vessel 21 interconnects inlet port 26 and inlet tubes 29 extending radially into reaction chamber 25. Conduit 28 and inlet tubes 29 are also preferably formed of the high nickel alloy used to construct reaction vessel 21. Thus, in the preferred reactor all or the major portion of the surfaces of walls 22, 23, and 24, and of internal fixtures, such as conduit 28 and inlet tubes 29, facing or defining reaction chamber 25 are of a material suitable for catalyzing and supporting whisker growth. Reaction chamber 25 is sealed from the ambient atmosphere in known manner to prevent contamination of the whiskers grown therein.

The surface area available for whisker growth may be increased by providing rods 31 extending radially from axial conduit 28 into reaction chamber 25. Rods 31 are also formed of a substrate material suitable for whisker growth, such as the high nickel alloy used to construct reaction vessel 21. As described above, all or the major portion of the surfaces of walls 22, 23, and 24, and of internal fixtures, such as conduit 28, inlet tubes 29 and rods 31, facing or defining reaction chamber 25 are of a material suitable for catalyzing and supporting whisker growth. As described above, alternatively the whisker growth surfaces may be of other suitable materials, or may be lined, coated or plated with such materials. Also as described above, all nickel or high nickel alloy surfaces intended for whisker growth are coated with a thin (20–30 micron) coat of TiC or TiN, for optimum growth and morphology of the whiskers.

Reaction vessel 21 is insertable into opening 32 in furnace 33 for heating of the reaction chamber or more particularly of the substrate material surfaces on which whisker growth is to take place, to an operating temperature suitable for whisker growth. Reaction vessel 21 and furnace 33 may be arranged so that all or nearly all of the surface defining reaction chamber 25 are heated to an operating temperature, or alternatively at least a major portion of the surface area defining reaction chamber 25 is formed from substrate materials and is heatable to the operating temperature. Alternatively other heating means may be used to heat the reaction surfaces to operating temperature. Thermocouple 34 may be provided, extending into reaction chamber 25 to monitor the operating temperature in the chamber.

In operation, for titanium carbide whisker growth, reaction vessel 21 is inserted into opening 32 in furnace 33, and reaction chamber 25 is heated to an operating temperature of about 1025°–1125° C., preferably about 1075°–1100° C., while being flushed with an inert gas such as argon. The inert gas follows the gas flow path described above, entering vessel 21, from a force not shown, through conduit 28 and inlet tubes 29, and exiting the chamber through outlet ports 27. The heated reaction chamber is then flushed with hydrogen gas, flowing at about ambient pressure, although pressures of about 1–2 atmospheres are possible. The hydrogen follows the gas flow path described above for the inert gas, to clean the chamber of any impurities present which may affect the growth. Following the flushing of reaction chamber 25 with hydrogen, a suitable pyrolyzable hydrocarbon as described above, for example methane, is introduced to the hydrogen stream and allowed to flow through the heated chamber for several minutes. The hydrocarbon contacting the heated surfaces is pyrolyzed to form a thin film of free carbon on the surfaces. The pressure within the reaction chamber preferably is maintained at about 1 atmosphere throughout the operation of the reactor.

The remainder of the process follows the same whisker growth, cooling, and flushing steps described above with respect to whisker growth on a substrate surface inserted into a reactor. However, during the whisker growth step, the reactant gases flow past and contact a surface area of heated substrate material surfaces many times greater than that described above. Thus, as illustrated above, all or a major portion of the surfaces facing or defining the reaction chamber may be used for growth of whiskers, making possible the production of commercial quantities of high quality metal carbide, nitride, or carbonitride whiskers of controlled growth and morphological characteristics.

The following Examples are provided to enable one skilled in the art to better understand and practice the process according to the invention. The Examples are intended to be merely illustrative, and are not to be viewed as limiting the scope of the invention as defined by the appended claims.

EXAMPLES 1–8

Growth of Titanium Carbide Whiskers

Whisker growth was carried out at about 1 atm pressure in a sealed reactor generally configured as described above for the reactor illustrated in FIG. 2 and formed of Inconel high nickel alloy coated with a 20–30 micron thick layer of TiC. The reactor was heated while being flushed with argon at 10 standard liters/min. The system was then flushed with hydrogen at 15 liters/min for about 15 min. Methane flowing at 0.6 liters/min was mixed with the hydrogen and allowed to flow for about 5 min, to pyrolyze and coat the substrate surface with a thin layer of free carbon. Titanium tetrachloride gas flowing at a rate of 75 cc/min, measured at 35° C., was then mixed with the hydrogen-methane mixture for whisker growth.

After the whisker growth period, the flows of methane and titanium tetrachloride were shut off, and the hydrogen was allowed to flow at 15 liters/min until the reactor cooled to ambient temperature. Finally, the system was flushed with argon at 10 liters/min for about 5 min before the reactor was opened to remove the whiskers.

Several runs were made. In Examples 1–4, the titanium tetrachloride was allowed to flow for whisker growth for varying lengths of time, at a reaction temperature of 1080° C. In Examples 5–8, the titanium tetrachloride was allowed to flow for 1 hr, at various reaction temperatures. The results are shown in Tables I and II, showing the dependence of aspect ratio (length to diameter) of the whiskers on time (Table I) and temperature (Table II), and in FIGS. 3 and 4.

TABLE I

| Example No. | Time, hr, @ 1080° C. | Aspect Ratio, L/D |
|---|---|---|
| 1 | 1 | 150:1 |
| 2 | 2 | 450:1 |
| 3 | 3 | 1000:1 |
| 4 | 4 | 1200:1 |

TABLE II

| Example No. | Temp, °C. | Aspect Ratio, L/D, @ 1 hr |
|---|---|---|
| 5 | 1025 | 30:1 |
| 6 | 1050 | 70:1 |
| 7 | 1080 | 150:1 |
| 8 | 1100 | 160:1 |

Figure 3:
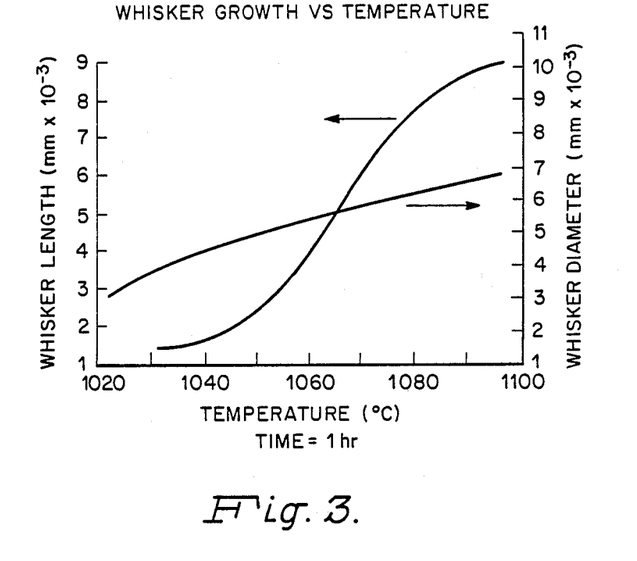
FIG. 3 is a graphical representation showing a relation between growth of titanium carbide whiskers and time.
Figure 4:
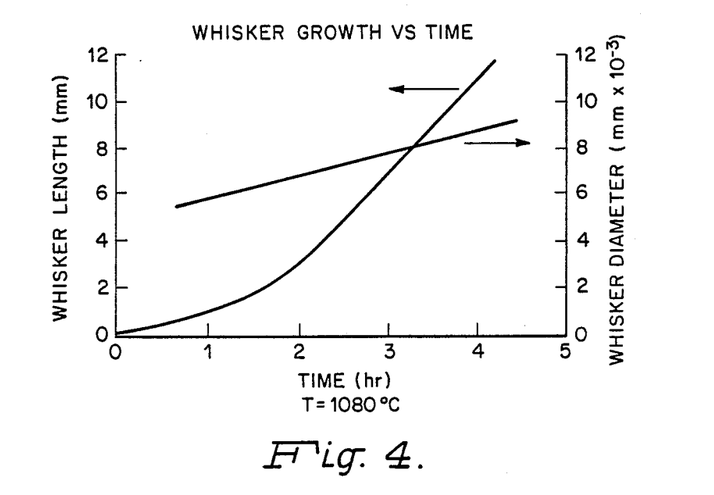
FIG. 4 is a graphical representation showing a relationship between growth of titanium carbide whiskers and temperature.

The relationship between whisker growth and time illustrated in FIG. 3 shows that after an initial nucleation period the growth of the whiskers both in length and diameter is linear with growth time. The dependence of whisker growth on temperature is illustrated in FIG. 4, which shows that efficient growth of the whiskers may be achieved between 1025° C. and 1125° C., and preferably between about 1075° C. to 1100° C. As may be seen by examining Tables I and II, the aspect ratio of length to diameter of the whiskers may be controlled by adjusting the time and temperature conditions of the whisker growth process. The preferred aspect ratio of diameter to length of the whiskers is about 1:20 to 1:400.

The shape and morphology of whiskers of Examples 1–8, grown using the process according to the invention, were observed using optical and scanning electron microscopy. The whiskers were found to be uniform in diameter, straight, smooth surfaced, and free of distortion. Electron diffraction showed the whiskers to be single crystal, while back-scatter electron channeling (transmission electron microscope) revealed three different growth axes, which are commonly found in titanium carbide whiskers, i.e. [100], [110], [111]. X-ray diffraction confirmed that the material was principally titanium carbide whiskers having [100], [110], and [111] growth axes. Total carbon and free carbon content were determined by conductometric analysis, and were found to be close to theoretical value. This is an important finding, since stoichiometry of whisker material determines to some extent the ductility and toughness. The impurities and their distribution in the whiskers were observed by emission spectroscopy and x-ray microanalysis. The total impurity content was found to be less than 1%. Microhardness was measured at room temperature by Knoop microhardness indentor and found to be 3300 KG/mm$^2$ ±300 KG/mm$^2$. Under the processing parameters tested, the whiskers are uniform in diameter, and have highly reflective surfaces without pits or other observable defects, enhancing strength and usefulness in composites.

EXAMPLE 9

Growth of Titanium Nitride Whiskers

Whisker growth is carried out at about 1 atm pressure in a sealed reactor generally configured as described above for the reactor illustrated in FIG. 2 and formed of Inconel high nickel alloy coated with a 20-30 micron thick layer of TiN. The reactor is heated to 1080° C. while being flushed with argon at 10 standard liters/min. The system is then flushed with hydrogen at 15 liters/min for about 15 min. Nitrogen gas flowing at 4.0 liters/min is mixed with the hydrogen and allowed to flow for about 5 min, to equilibrate the system. Titanium tetrachloride gas flowing at a rate of 50 cc/min, measured at 35° C., is then mixed with the hydrogen-nitrogen mixture for 1 hr. for whisker growth.

After the whisker growth period, the flows of nitrogen and titanium tetrachloride are shut off, and the hydrogen is allowed to flow at 15 liters/min until the reactor cools to ambient temperature. Finally, the system is flushed with argon at 10 liters/min for about 5 min before the removal of the TiN whiskers.

Although the above Examples deal with the growth of titanium carbide and titanium nitride whiskers, at specific temperatures and for specific growth periods, on coated and carburized high nickel alloy surfaces, using titanium tetrachloride and methane or nitrogen as reactants, the invention is not limited to the specific Examples. For example, the metal halide reactant gases may include halides of titanium, zirconium, hafnium, niobium, tantalum, or tungsten. Also, a mixture of metal halides may be used to produce whiskers comprising a solid solution of metal carbides, nitrides, or carbonitrides. The hydrocarbon gases preferred for carburizing the reactor surfaces and as reactants for carbide whisker growth include hydrocarbon compounds of the formulas $C_nH_{2n+2}$, $C_nH_{2n}$, or $C_nH_{2n-2}$, where n is a positive integer of 1-4. The most preferred hydrocarbons are methane, propane, and acetylene. Nitrogen gas and/or ammonia may be substituted for or mixed with the hydrocarbon gas to produce nitride or carbonitride whiskers.

Substrate surfaces preferred for the growth of the whiskers include nickel or an alloy containing at least 50% by weight nickel, coated with a titanium carbide or nitride layer about 20-30 microns thick, or, for the carbide or carbonitride whiskers, graphite impregnated with about 0.1-1.0 mole % nickel. In the case of the titanium carbide coated nickel or nickel alloy, carburizing of the substrate surfaces, i.e. forming a thin film of pyrolytic carbon thereon, appears to be a necessary step in preparing the substrate surfaces for optimally efficient carbide whisker growth.

The present invention provides an efficient and commercially useful method of producing high quality, single crystal metal carbide, nitride, or carbonitride whiskers useful for composite technology. For example, whiskers produced by the method described above and recited in the appended claims, incorporated in composite materials, are expected to provide composite materials having increased fracture toughness, hardness, and wear resistance for such applications as cutting tools, wear parts, dies, turbines, nozzles, and the like.

While there has been shown and described what are at present considered the preferred embodiments of the invention, it will be obvious to those skilled in the art that various changes and modifications can be made therein without departing from the scope of the invention as defined by the appended claims.

What is claimed is:

1. A process for producing metal carbide, nitride, or carbonitride whiskers comprising the steps of:
   A. flushing a reaction chamber sealed from the ambient atmosphere with flowing hydrogen gas, wherein the reaction chamber includes one or more substrate surfaces formed from one or more substrate materials suitable for providing catalyzing and supporting substrates for nucleation and growth of the whiskers, and wherein the substrate surfaces are maintained at an operating temperature of about 1025°-1125° C.; and
   B. mixing with the hydrogen flowing through the reaction chamber, at about ambient pressure, reactants comprising one or more metal halide gas selected from the group consisting of halides of titanium, zirconium, hafnium, niobium, tantalum, and tungsten, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitable linear velocity for a time sufficient to nucleate and grow the metal carbide, nitride, or carbonitride whiskers on the substrate material surfaces.

2. A process according to claim 1 wherein the linear velocity of the flowing gas mixture is maintained at about 120-140 cm/sec.

3. A process according to claim 1 wherein the reaction chamber is arranged generally vertically above and open to a collecting chamber, the collecting chamber being sealed from the ambient atmosphere and being maintained at a temperature sufficiently below the operating temperature to preclude significant reaction of the reactants therein; and further comprising the step of, at least once during the growth of the whiskers, and after time intervals sufficient to permit whisker growth, detaching at least some of the whiskers from the substrate surfaces to fall downward into the collecting chamber to permit additional whiskers to nucleate and grow on the substrate surfaces.

4. A process according to claim 3 wherein the whisker growth time intervals and the operating temperature are selected to produce whiskers having an aspect ratio of diameter to length of about 1:20 to 1:400.

5. A process according to claim 3 wherein the collecting chamber is reversibly sealable from the reaction chamber and further comprising the steps of, intermittently during the whisker growth step, sealing the collecting chamber from the reaction chamber; removing the collected whiskers from the reactor; and reopening the collecting chamber to the reaction chamber for collection of additional whiskers.

6. A process for producing metal carbide whiskers comprising the steps of:
  A. flushing a reaction chamber sealed from the ambient atmosphere with flowing hydrogen gas, wherein the reaction chamber includes one or more substrate surfaces formed from one or more substrate materials suitable for providing catalyzing and supporting substrates for nucleation and growth of the whiskers, and wherein the substrate surfaces are maintained at an operating temperature of about 1025°–1125° C.; and
  B. mixing with the hydrogen flowing through the reaction chamber, at about ambient pressure, reactants comprising a metal halide gas selected from the group consisting of halides of titanium, zirconium, hafnium, niobium, tantalum, and tungsten, and one or more aliphatic hydrocarbon gases pyrolyzable at the operating temperature to form free carbon, in an atomic ratio of carbon to metal of about 5:1 to 16:1 and a volume ratio of hydrocarbon to hydrogen of about 1:5 to 1:20, the flowing mixture of gases being maintained at a suitable linear velocity for a time sufficient to nucleate and grow metal carbide whiskers on the substrate material surfaces.

7. A process according to claim 6 wherein the operating temperature is about 1075°–1100° C.

8. A process according to claim 6 wherein the atomic ratio of carbon to metal is about 8:1 to 12:1.

9. A process according to claim 6 wherein the linear velocity of the flowing gas mixture is maintained at about 120–140 cm/sec.

10. A process according to claim 6 wherein the reaction time and operating temperature are selected to produce metal carbide whiskers having an aspect ratio of diameter to length of about 1:20 to 1:400.

11. A process according to claim 6 wherein the metal halide gas is selected from the group consisting of chlorides of titanium, zirconium, hafnium, niobium, tantalum, and tungsten; and the hydrocarbon gases are selected from the group consisting of compounds of the formulas $C_nH_{2n+2}$, $C_nH_{2n}$, and $C_nH_{2n-2}$, where n is a positive integer of 1–4.

12. A process according to claim 11 wherein the hydrocarbon gases are selected from the group consisting of methane, propane, and acetylene.

13. A process for producing metal carbide whiskers comprising the steps of:
  A. heating a reaction chamber sealed from the ambient atmosphere to an operating temperature of about 1025°–1125° C. in an inert atmosphere, the reaction chamber including one or more substrate surfaces formed from one or more substrate materials selected from the group consisting of nickel and an alloy containing at least 50% by weight nickel each coated with a titanium carbide or nitride layer about 20–30 microns thick, and graphite impregnated with about 0.1–1.0 mole % nickel;
  B. flushing the heated reaction chamber with flowing hydrogen gas;
  C. where the one or more substrate materials include titanium carbide or nitride coated nickel or nickel alloy, mixing with the hydrogen flowing through the flushed reaction chamber, an aliphatic hydrocarbon gas pyrolyzable at the operating temperature to form free carbon, in a molar ratio, at a flow rate and for a time sufficient to form a thin film of pyrolytic carbon on the substrate material surfaces; and
  D. mixing with the hydrogen flowing through the reaction chamber, at about ambient pressure, reactants comprising one or more metal halide gases selected from the group consisting of halides of titanium, zirconium, hafnium, niobium, tantalum, and tungsten, and one or more aliphatic hydrocarbon gases pyrolyzable at the operating temperature to form free carbon and which may be the same or different from the hydrocarbon of step C, in an atomic ratio of carbon to metal of about 5:1 to 16:1, and a volume ratio of hydrocarbon to hydrogen of about 1:5 to 1:20, the flowing mixture of gases being maintained at a linear velocity of about 120–140 cm/sec, for a time sufficient to nucleate and grow metal carbide whiskers on the substrate material surfaces.

14. A process according to claim 13 wherein the operating temperature is about 1075°–1100° C.

15. A process according to claim 13 wherein the atomic ratio of carbon to metal is about 8:1 to 12:1.

16. A process according to claim 13 wherein the reaction time and operating temperature are selected to produce metal carbide whiskers having an aspect ratio of diameter to length of about 1:20 to 1:400.

17. A process according to claim 13 wherein the hydrocarbon reactant gases are selected from the group consisting of compounds of the formulas $C_nH_{2n+2}$, $C_nH_{2n}$, and $C_nH_{2n-2}$, where n is a positive integer of 1–4.

18. A process according to claim 13 wherein the metal halide gas is $TiCl_4$ and the hydrocarbon reactant gases are selected from the group consisting of methane, propane, and acetylene.

19. A process for producing metal carbide, nitride, or carbonitride whiskers according to claim 1, comprising the steps of:
  A. flushing a reaction chamber sealed from the ambient atmosphere with flowing hydrogen gas, wherein the reaction chamber is defined by surfaces of which at least a major portion of the surface area is formed from one or more substrate materials suitable for providing catalyzing and supporting substrates for nucleation and growth of the whiskers, and wherein the substrate material surfaces are maintained at an operating temperature of about 1025°–1125° C.; and
  B. mixing with the hydrogen flowing through the reaction chamber, at about ambient pressure, reactants comprising one or more metal halide gases selected from the group consisting of halides of titanium, zirconium, hafnium, niobium, tantalum, and tungsten, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitable linear velocity for a time sufficient to nucleate and grow the metal carbide, nitride, or carbonitride whiskers on the substrate material surfaces.

20. A process according to claim 19 wherein the linear velocity of the flowing gas mixture is maintained at about 120–140 cm/sec.

21. A process according to claim 19 wherein: the one or more substrate materials are selected from the group consisting of nickel and an alloy containing at least 50% by weight nickel each coated with a titanium carbide or nitride layer about 20–30 microns thick, and graphite impregnated with about 0.1–1.0 mole % nickel.

22. A process for producing metal carbide whiskers comprising the steps of:
A. flushing a reaction chamber sealed from the ambient atmosphere with flowing hydrogen gas, wherein the reaction chamber is defined by surfaces of which at least a major portion of the surface area is formed from one or more substrate materials suitable for providing catalyzing and supporting substrates for nucleation and growth of the whiskers, and wherein the substrate material surfaces are maintained at an operating temperature of about 1025°–1125° C.; and
B. mixing with the hydrogen flowing through the reaction chamber, at about ambient pressure, reactants comprising a metal halide gas selected from the group consisting of halides of titanium, zirconium, hafnium, niobium, tantalum, and tungsten, and one or more aliphatic hydrocarbon gases pyrolyzable at the operating temperature to form free carbon, in an atomic ratio of carbon to metal of about 5:1 to 16:1 and a volume ratio of hydrocarbon to hydrogen of about 1:5 to 1:20, the flowing mixture of gases being maintained at a suitable linear velocity for a time sufficient to nucleate and grow metal carbide whiskers on the substrate material surfaces.

23. A process according to claim 22 wherein the operating temperature is about 1075°–1100° C.

24. A process according to claim 22 wherein the atomic ratio of carbon to metal is about 8:1 to 12:1.

25. A process according to claim 22 wherein the linear velocity of the flowing gas mixture is maintained at about 120–140 cm/sec.

26. A process according to claim 22 wherein the reaction time and operating temperature are selected to produce metal carbide whiskers having an aspect ratio of diameter to length of about 1:20 to 1:400.

27. A process according to claim 22 wherein the metal halide gas is selected from the group consisting of chlorides of titanium, zirconium, hafnium, niobium, tantalum, and tungsten; and the hydrocarbon gases are selected from the group consisting of compounds of the formulas $C_nH_{2n+2}$, $C_nH_{2n}$, and $C_nH_{2n-2}$, where n is a positive integer of 1–4.

28. A process according to claim 27 wherein the hydrocarbon gases are selected from the group consisting of methane, propane, and acetylene.

29. A process for producing metal carbide whiskers comprising the steps of:
A. heating a reaction chamber sealed from the ambient atmosphere to an operating temperature of about 1025°–1125° C. in an inert atmosphere, the reaction chamber being defined by surfaces of which at least a major portion of the surface area is formed from one or more substrate materials selected from the group consisting of nickel and an alloy containing at least 50% by weight nickel each coated with a titanium carbide or nitride layer about 20–30 microns thick, and graphite impregnated with about 0.1–1.0 mole % nickel;
B. flushing the heated reaction chamber with flowing hydrogen gas;
C. where the one or more substrate materials include titanium carbide or nitride coated nickel or nickel alloy, mixing with the hydrogen flowing through the flushed reaction chamber, an aliphatic hydrocarbon gas pyrolyzable at the operating temperature to form free carbon, in a molar ratio, at a flow rate and for a time sufficient to form a thin film of pyrolytic carbon on the substrate material surfaces; and
D. mixing with the hydrogen flowing through the reaction chamber, at about ambient pressure, reactants comprising one or more metal halide gases selected from the group consisting of halides of titanium, zirconium, hafnium, niobium, tantalum, and tungsten, and one or more aliphatic hydrocarbon gases pyrolyzable at the operating temperature to form free carbon and which may be the same or different from the hydrocarbon of step C, in an atomic ratio of carbon to metal of about 5:1 to 16:1, and a volume ratio of hydrocarbon to hydrogen of about 1:5 to 1:20, the flowing mixture of gases being maintained at a linear velocity of about 120–140 cm/sec, for a time sufficient to nucleate and grow metal carbide whiskers on the substrate material surfaces.

30. A process according to claim 29 wherein the operating temperature is about 1075°–1100° C.

31. A process according to claim 29 wherein the atomic ratio of carbon to metal is about 8:1 to 12:1.

32. A process according to claim 29 wherein the reaction time and operating temperature are selected to produce metal carbide whiskers having an aspect ratio of diameter to length of about 1:20 to 1:400.

33. A process according to claim 29 wherein the hydrocarbon reactant gases are selected from the group consisting of compounds of the formulas $C_nH_{2n+2}$, $C_nH_{2n}$, and $C_nH_{2n-2}$, where n is a positive integer of 1–4.

34. A process according to claim 29 wherein the metal halide gas is $TiCl_4$ and the hydrocarbon reactant gases are selected from the group consisting of methane, propane, and acetylene.

* * * * *